(12) United States Patent
McCarthy

(10) Patent No.: US 7,720,126 B2
(45) Date of Patent: May 18, 2010

(54) MULTI-PASS LASER AMPLIFIER WITH STAGED GAIN MEDIUMS OF VARIED ABSORPTION LENGTH

(75) Inventor: John C. McCarthy, Stratham, NH (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 263 days.

(21) Appl. No.: 12/151,384

(22) Filed: May 6, 2008

(65) Prior Publication Data

US 2009/0279577 A1 Nov. 12, 2009

(51) Int. Cl.
  *H01S 3/091* (2006.01)
(52) U.S. Cl. ............... 372/75; 372/70; 372/97; 372/99; 372/100; 372/41
(58) Field of Classification Search ............. 372/75, 372/70, 97, 99, 100, 34, 41
  See application file for complete search history.

(56) References Cited

U.S. PATENT DOCUMENTS

2006/0109878 A1* 5/2006 Rothenberg ............... 372/35
2006/0262815 A1* 11/2006 Klimov et al. ............. 372/18
2009/0003402 A1* 1/2009 Nunen et al. ............... 372/72

* cited by examiner

*Primary Examiner*—Minsun Harvey
*Assistant Examiner*—Kinam Park
(74) *Attorney, Agent, or Firm*—Neil F. Maloney; Grossman, Tucker, Perreault & Pfleger, PLLC

(57) ABSTRACT

A laser amplification system is disclosed that enables reliable operation over large ambient temperature operating window, as well as a significant reduction of laser temperature sensitivity typically associated with diode pumped lasers. The techniques employed by the system effectively eliminate damaging gain hot spots and lower ASE and ESA thresholds, thereby increasing laser peak and average power levels. Additionally, the techniques allow for thermal programming of active gain medium material to minimize thermally induced aberrations. In one particular example embodiment, a variable dopant concentration multi-pass laser amplifier is provided having a customized active ion concentration profile, tailoring the combination of laser absorption and gain distribution using a ceramic YAG host.

20 Claims, 6 Drawing Sheets

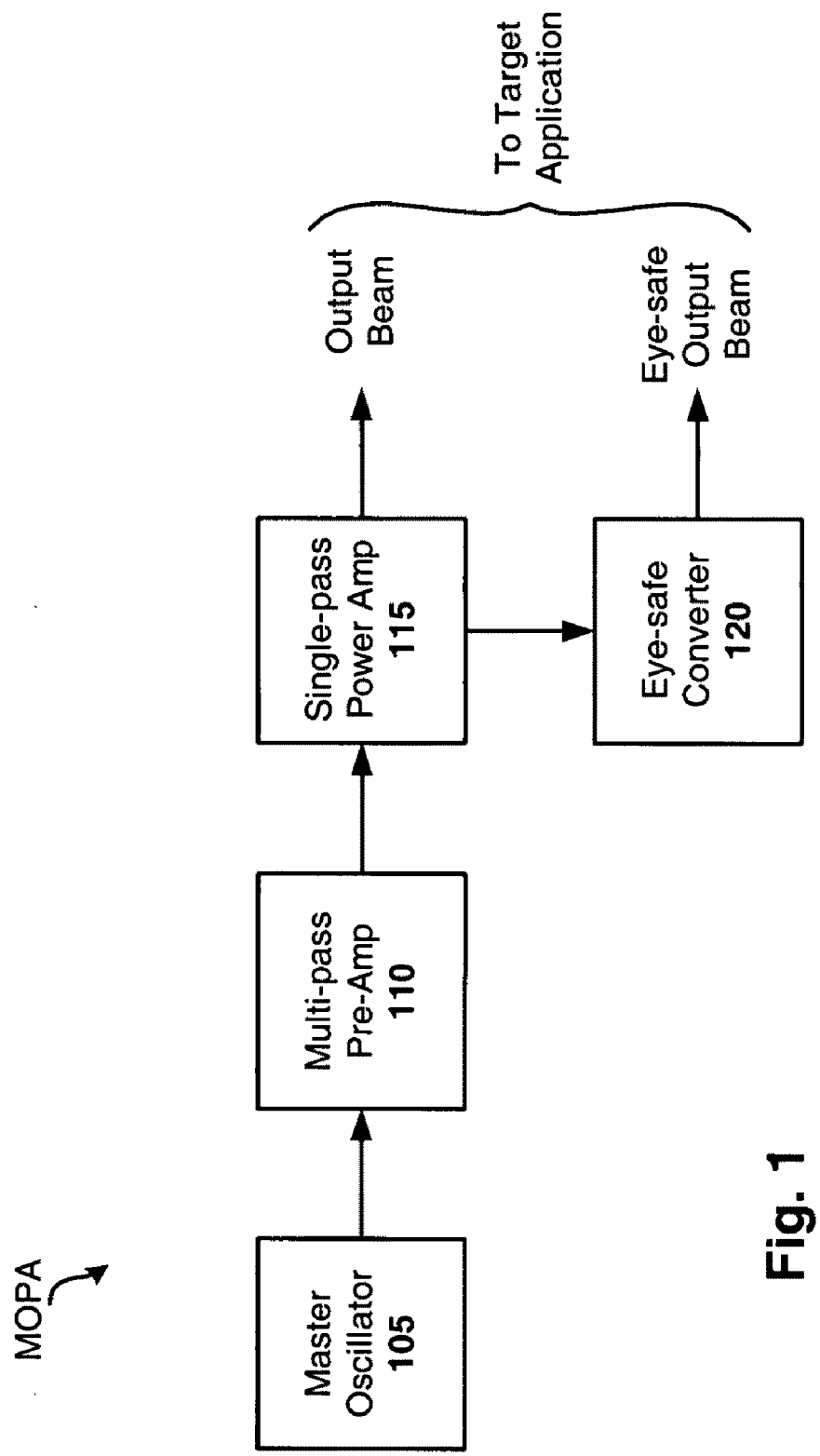

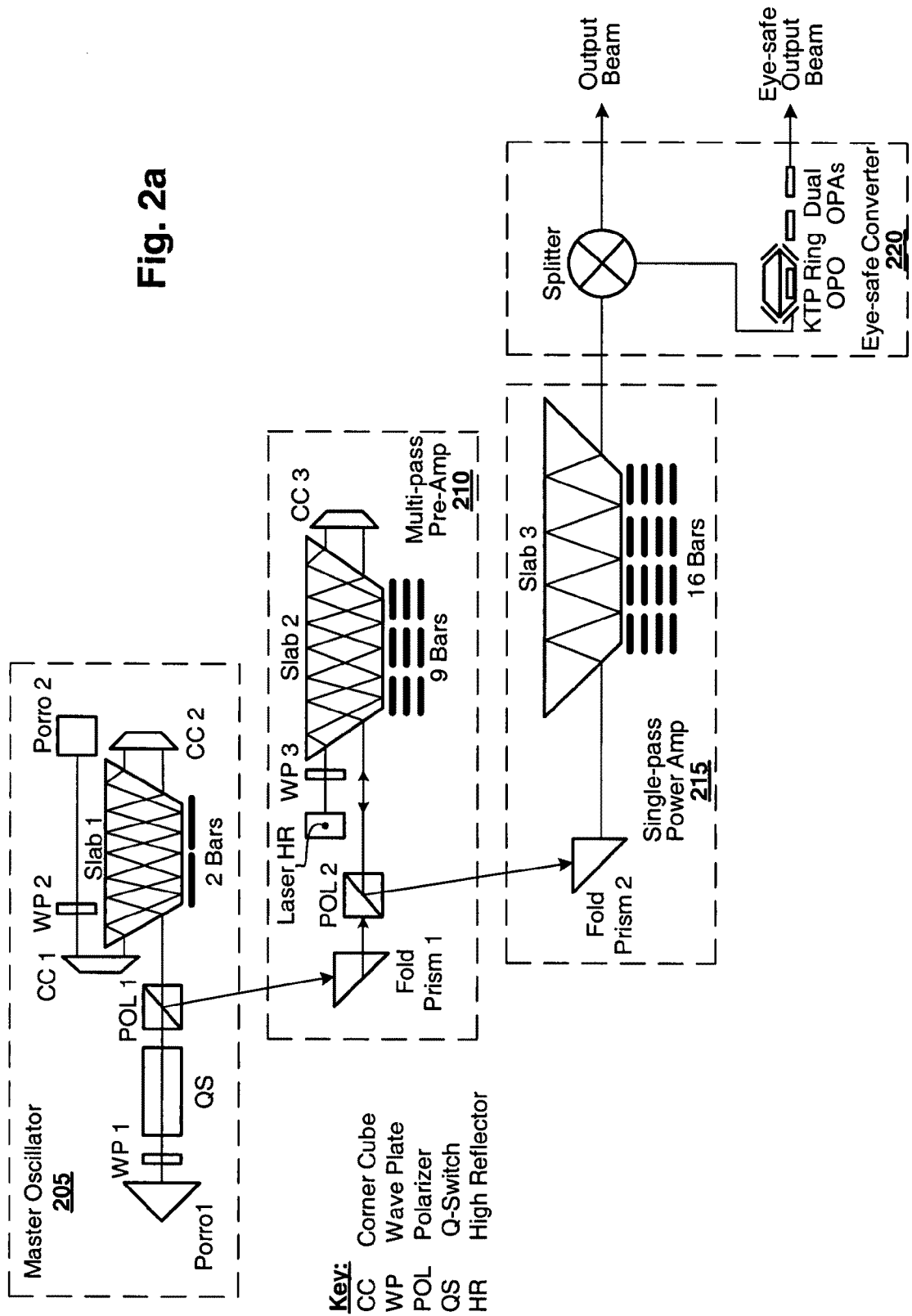

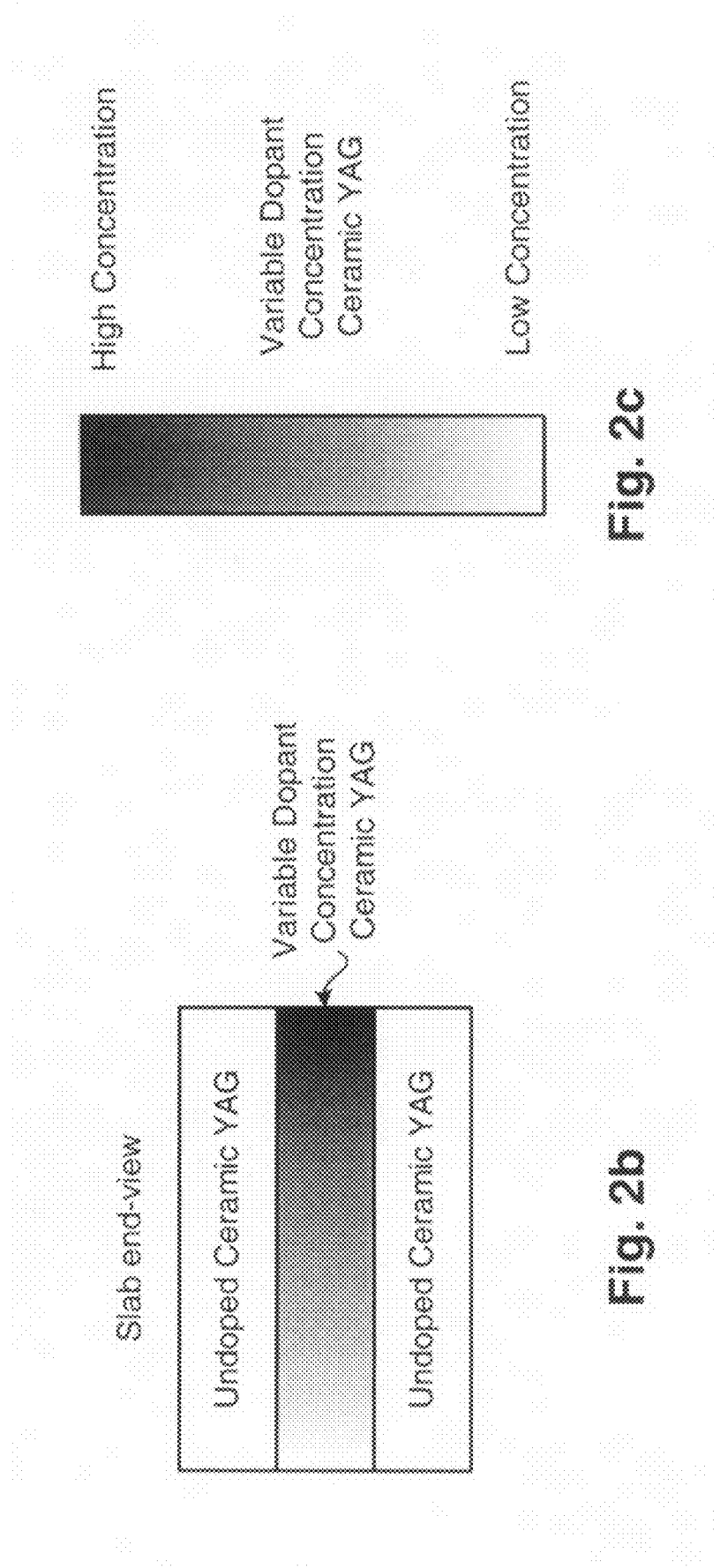

MULTI-PASS LASER AMPLIFIER WITH STAGED GAIN MEDIUMS OF VARIED ABSORPTION LENGTH

FIELD OF THE INVENTION

The invention relates to lasers, and more particularly, to a laser amplifier having varied absorption length gain mediums.

BACKGROUND OF THE INVENTION

As is known, a laser produces an intense, coherent, directional beam of light or radiation. A laser generally includes three main components: an energy 'pump' source, a gain medium, and a resonator cavity. The energy pump source generates a population inversion in the gain medium, and the gain medium amplifies light traveling therein. The resonator cavity typically includes a mirror disposed at each end of the gain medium, effectively defining the cavity. The pump source can be implemented, for example, with a laser diode array or flash-lamp, and the gain medium can be implemented as gas, liquid, or solid, as typically done.

During the lasing process, photons propagating along the axis of the cavity bounce back and forth across the active medium, thereby building intensity. The light in the cavity forms resonant standing waves having a frequency equal to n(c/2D), where n is the standing wave pattern or mode (e.g., 1, 2, 3, etc), c is the speed of light, and D is the distance between the mirrors. These modes are sustained in the resonator cavity, and the generated light beam is generally limited to be within the corresponding range of frequencies.

As is further known, pumping of uniformly doped gain medium tends to cause non-uniform heating or "hot-spots", which causes internal stress/strain within the medium where the outer surfaces are cooled. This problem is exacerbated when longitudinal pumping with a single wavelength pump source. In more detail, consider the exponential decay of the transmission function: $I=I_0 e^{(-\alpha l)}$, where $I_0$ is the input pump beam, $\alpha$ is the absorption coefficient at the pump wavelength, and l is the propagation distance through the gain medium. Thus, more energy is absorbed at the beginning of the gain medium than at the end of the gain medium. Longitudinal pumping of a uniformly doped host can also cause localized thermal augmentation due to excited state absorption (ESA) and upconversion processes, both of which are exacerbated by uneven pump energy absorption.

As is further known, amplified spontaneous emission (ASE) is produced when a laser gain medium is pumped to generate a population inversion. Feedback of the ASE by the resonator cavity may produce laser operation if the lasing threshold is reached. Excessive ASE, however, is undesirable, because it limits the gain that can be achieved in the gain medium. This is particularly problematic in high gain lasers, and ASE must be mitigated in such applications so that it does not deplete the excitation of the gain medium, thereby allowing the desired coherent laser radiation to do so.

Typical solutions to such problems include using more pump diodes of varied spectral outputs, to insure some percentage of pump diodes will be in laser material absorption band, or using reduced, uniform dopant concentration and long absorption path to provide sufficient pump absorption off pump diode peak wavelength. These solutions are associated with a number of disadvantages, such as limited operating ambient temperature window, low ASE and ESA thresholds, and/or complex optical arrangements that are expensive to manufacture.

What is needed, therefore, are better laser amplifier designs.

SUMMARY OF THE INVENTION

One embodiment of the present invention provides a laser amplification system. The system includes a master oscillator for generating a seed laser beam, and having a gain medium associated with a first energy absorption length per pass. The system further includes a multi-pass pre-amplifier for receiving the seed laser beam and generating an amplified version of that beam, using a multi-pass optical architecture. The pre-amplifier has a gain medium associated with a second energy absorption length per pass that is longer than the first energy absorption length. The system further includes a single-pass power amplifier for receiving the amplified version of the seed laser beam and generating a laser output beam therefrom, using a single-pass optical architecture. The power amplifier has a gain medium associated with a third energy absorption length per pass that is longer than the second energy absorption length. The system may further include an eye-safe converter for receiving the laser output beam and converting that beam to an eye-safe wavelength, and/or a thermoelectric cooler (TEC) controller for stabilizing pump source temperature in a desired absorption band. Each of the gain mediums may have, for example, a varied dopant concentration along both is length and cross-section. In one specific case, each of the gain mediums is a side-pumped ceramic Nd:YAG slab having a varied dopant concentration between about 0.0 and 1.5%. Each of the gain mediums can be pump directly pumped using diode bars. In one particular case, each gain medium is pumped using a pump source having an emission bandwidth in the range of 5 nm to 7 nm. In another particular case, the gain medium of the multi-pass pre-amplifier is sized so that the seed laser beam is capable of achieving a desired energy level for extraction of energy stored within that gain medium, in two passes (i.e., double-pass) of the seed laser beam through that gain medium. The system may be configured to operate on multiple absorption bands, depending on ambient temperature (e.g., 795 nm absorption peak for cold operation, and 807 nm absorption peak for hot operation). The system may use a single set of pump diodes.

Another embodiment of the present invention provides a method for laser amplification. The method includes generating a seed laser beam, using a gain medium associated with a first energy absorption length per pass. The method continues with generating an amplified version of the seed laser beam, using a multi-pass optical architecture that includes a gain medium associated with a second energy absorption length per pass that is longer than the first energy absorption length. The method continues with generating a laser output beam from the amplified version of the seed laser, using a single-pass optical architecture that includes a gain medium associated with a third energy absorption length per pass that is longer than the second energy absorption length. The method may further include converting the laser output beam to an eye-safe wavelength, and/or stabilizing pump source temperature in a desired absorption band. In one particular case, each of the gain mediums is a ceramic Nd:YAG slab having a varied dopant concentration between about 0.0 and 1.5%. The method may further include side-pumping each of the gain mediums using a pump source having an emission bandwidth in the range of 5 nm to 7 nm. Each of the gain mediums may have a varied dopant concentration along both is length and cross-section.

The features and advantages described herein are not all-inclusive and, in particular, many additional features and advantages will be apparent to one of ordinary skill in the art in view of the drawings, specification, and claims. Moreover, it should be noted that the language used in the specification has been principally selected for readability and instructional purposes, and not to limit the scope of the inventive subject matter.

BRIEF DESCRIPTION OF THE DRAWINGS

FIG. 1 is a block diagram showing a master oscillator power amplifier (MOPA) laser system configured in accordance with one embodiment of the present invention.

FIG. 2a is an optical layout of a MOPA laser system configured in accordance with one embodiment of the present invention.

FIG. 2b is an end-view of a slab having a varied dopant concentration, configured in accordance with one embodiment of the present invention.

FIG. 2c illustrates the varied dopant concentration portion of a slab, configured in accordance with one embodiment of the present invention.

DETAILED DESCRIPTION OF THE INVENTION

Figure 3:
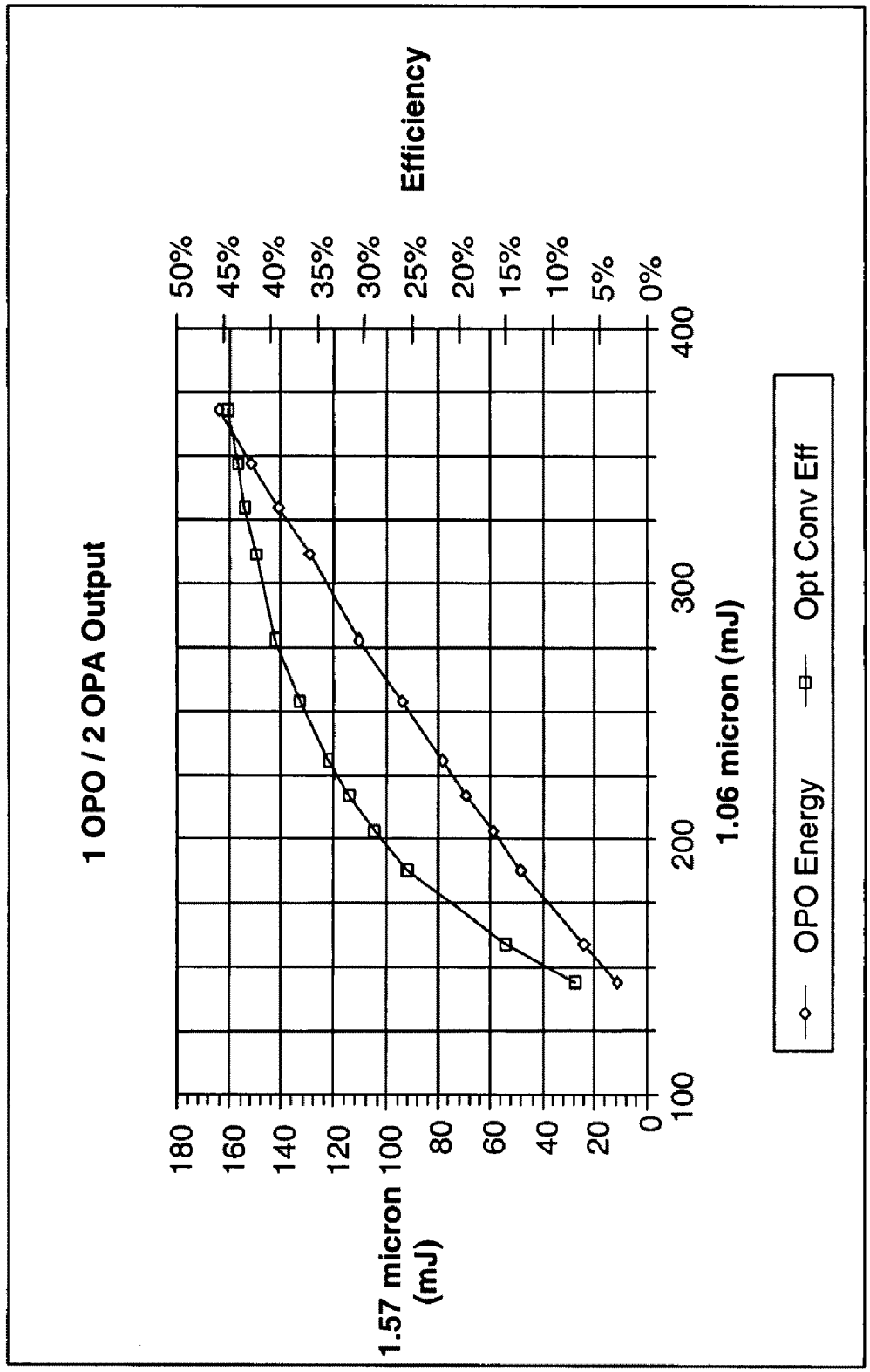
FIG. 3 illustrates a graph showing high energy and efficiency of an eye-safe converter module configured in accordance with one embodiment of the present invention.

A laser amplification system is disclosed that enables reliable operation over large ambient temperature operating window, as well as a significant reduction of laser temperature sensitivity typically associated with diode pumped lasers. The techniques employed by the system effectively eliminate damaging gain hot spots and lower ASE and ESA thresholds, thereby increasing laser peak and average power levels. Additionally, the techniques allow for thermal programming of active gain medium material to minimize thermally induced aberrations.

In one particular example embodiment, a variable dopant concentration multi-pass laser amplifier is provided having a customized active ion concentration profile, tailoring the combination of laser absorption and gain distribution using a ceramic YAG host. The laser amplifier can be implemented with relatively low cost and complexity using an optical configuration amenable to compact robust packaging, and produces high peak powers. The laser amplifier can be used, for example, in low cost, compact laser transmitter applications, such as those applications in medical imaging, light detection and ranging (LIDAR), targeting, and surveillance. In addition, the laser amplifier can be configured for eye-safe transmitter applications, although other applications will be apparent in light of this disclosure (such as those applications having wavelengths from the ultraviolet to the mid infrared).

System Architecture

FIG. 1 illustrates a master oscillator power amplifier (MOPA) laser system configured in accordance with one embodiment of the present invention. A MOPA generally refers to a configuration that includes a master or 'seed' laser and an optical amplifier that increases the output power of the laser system. A MOPA configuration decouples beam formation (e.g., beam quality, line width, and pulse duration) from beam amplification (e.g., high power generation), thereby making it easier, relative to a conventional direct output laser systems, to achieve desired output beam parameters when the required laser output power is high.

In the example configuration shown, the laser amplifier includes a master oscillator 105, a multi-pass pre-amplifier 110, a single-pass power amplifier 115, and an optional eye-safe converter 120. The pump sources and coupling optics for each of oscillator 105, pre-amplifier 110, and amplifier 115 stages are integrated into the respective modules, although they can be implemented external to the modules as well. As previously explained, the laser output can be provided to any number of designator-illuminator applications, whether eye-safe or not.

The master oscillator 105 essentially acts as a seed laser and generates a low energy laser beam having desired beam qualities for subsequent amplification. Example such beam qualities include laser pulsewidth, beam quality, spectral width, and other such beam parameters that are easier to implement at low energy (relative to high energy beams). The master oscillator 105 can be implemented, for example, with a crossed-Porro corner cube design that is polarization outcoupled, to feed the multi-pass pre-amplifier 110. In one such embodiment, the oscillator 105 is implemented using miniature optics, and dual corner cube translation is used to limit laser oscillation to a $TEM_{00}$ mode, with corner cubes acting as a soft aperture. The output of master oscillator 105 can be, for example, in the range of 1 mJ to 25 mJ and at a wavelength in the range of 400 nm to 2000 nm (e.g., seed laser of 10 mJ at 1064 nm). Other suitable seed laser configurations and modes will be apparent in light of this disclosure, and can be used depending on the demands of the target application.

The multi-pass pre-amplifier 110 receives the seed laser out-coupled from the master oscillator 105 and provides a combination of amplification and beam quality capable of saturating the single-pass power amplifier 115. The multi-pass pre-amplifier 110 can be staged, for example, with a relatively small diameter to most efficiently boost the master oscillator 105 signal prior to power amplification. In more detail, the percentage of extractable energy from a given laser material cross-section is dependent on the amount of energy per unit area that is injected into the material. Each laser material (gain medium or "slab") has a saturation energy value, which if achieved, allows for an optimal amount of energy to be extracted. Thus, the combination of the extracting laser beam size (and intensity) can be mated to the desired slab size, to achieve efficient extraction. For instance, if the output of the master oscillator 105 is sent directly into the power amplifier 115, the beam size would have to be increased to the point that energy per unit area of the slab would be well below the saturation point of the power amplifier 115, and would only extract a low percentage of the stored energy. The pre-amplifier 110 resolves this problem, by double passing (or more) the seed laser through a correspondingly sized slab, so the overall extraction of the combination (both passes) is efficient.

In one particular embodiment, each of the master oscillator 105, multi-pass pre-amplifier 110, and single-pass power amplifier 115 are side-pumped ceramic Nd:YAG slabs having a varied dopant concentration between about 0.0 and 1.5%, and extraction geometry selected to provide increased absorption length and ASE suppression. The ceramic Nd:YAG slabs of varied geometry are directly pumped using, for example, diode bars or other suitable pump sources. Each subsequent staged slab is longer than the previous stage slab, to provide progressively increased absorption length (per pass), which in turn improves overall efficiency.

As will be appreciated, the pump source parameters can be vary depending on the gain medium/slab materials and desired performance. The pump source wavelength can be, for example, in the range of the ultraviolet (UV) to infrared (IR) spectrums. In one particular embodiment, the pump source has a wavelength in the range of 400 nm to 1000 nm (e.g., 795 to 807 nm, depending on operation temperature), and a pulsewidth in the range of about 10 μsec to 500 μsec. Power capability of the total pump source may include, for example, power levels ranging from about 100 mJ to 1000 mJ (e.g., 10 mJ to 100 mJ at the oscillator 105 stage, 100 mJ to 500 mJ at the pre-amp 110 stage, and 200 mJ to 900 mJ at the power amp 115 stage). Numerous staged pump schemes can be used as will be apparent in light of this disclosure, and the present invention is not intended to be limited to any particular one.

In one embodiment, the MOPA laser system is capable of producing a laser output of about 50 mJ to 500 mJ in the UV to IR spectrums (e.g., at 1064 nm). This example MOPA laser system exhibits reduced temperature sensitivity by using a combination of staged progressively longer absorption lengths per pass (from master oscillator 105 to pre-amp 110 to power amp 115), wider pump source emission bandwidth (e.g., 5 nm to 7 nm, as opposed to typically used 3 nm), and separate absorption bands depending on the ambient temperature (e.g., 795 nm absorption peak for cold operation, and 807 nm absorption peak for hot operation). The system may be further configured with additional features, such as a smart pump source drive controller that accommodates increased pump efficiency at cold operating temperatures.

In addition, using ceramic YAG (yttrium aluminum garnet) technology in accordance with some embodiments of the present invention allows monolithic fabrication of crystals with varied dopant concentration along the length and cross-section of the active area. The design is compatible with use of higher power pump bars (as compared to conventional end-pumping), and can be used to enable a staged laser designator for targeting applications, by providing designation modules for varied requirements (e.g., 5 mJ to 100 mJ) dictated by application details such as platform weight, munitions seeker type, and required range.

FIG. 2a is an optical layout of a MOPA laser system configured in accordance with one embodiment of the present invention. The system can be employed, for example, as a laser designator (e.g., target illuminator for laser guided munitions) as well as in numerous commercial applications such as surveillance, range-finding, and medical imaging.

As can be seen, the system includes a master oscillator 205, a multi-pass pre-amplifier 210, a single-pass power amplifier 215, and an optional eye-safe converter 220. These staged modules may represent specific embodiments of the corresponding modules shown in FIG. 1, although other specific embodiments having various optical layouts and componentry configured in a staged fashion with gain medium having varied geometries and dopant concentrations and can also be used, as will be apparent in light of this disclosure.

The master oscillator 205 in this example embodiment is configured as a 10 mJ, $TEM_{00}$ master oscillator, and employs a crossed-Porro corner cube design which is polarization outcoupled. Miniature optics including Porro prisms (Porro 1 and Porro 2) and waveplates (WP 1 and WP 2) are used to direct and shape the beam, and dual corner cube translation is used to limit laser oscillation to the $TEM_{00}$ mode, with corner cubes acting as soft aperture. The corner cubes (CC 1 and CC 2) each have three mutually perpendicular surfaces and an aperture face. Each cube operates as a beam translator (based on the principle of total internal reflection), such that a beam entering the effective aperture of the cube is reflected by the three perpendicular surfaces and then exits from the aperture face parallel to the beam's entrance path. This operation is beneficially alignment insensitive. Each waveplate adjusts LSR polarization, depending on the waveplate's angle of rotation. The Q-switch (QS) effectively operates as an electro-optic shutter to switch the cavity state from storage mode to lasing mode, as normally done. The gain medium (Slab 1) has a variable dopant concentration, and is side-pumped by two diode bars. The output of the master oscillator 205 is outcoupled to the pre-amp 210 by a polarizer (POL 1), which polarizes the beam and can be implemented for example as a thin film dielectric polarizer. The output can be, for instance, a 10 mJ, 20 ns laser pulse. Additional details of Slab 1, as well as Slab 2 and Slab 3, will be discussed in turn.

The multi-pass pre-amplifier 210 receives the output of the master oscillator 205 via a fold prism (Fold Prism 1), which is configured to direct the beam to a polarizer (POL 2) on the cavity input of the pre-amp 210. The pre-amp 205 can be staged with a diameter configured to most efficiently amplify the master oscillator 205 output signal in multiple passes, prior to power amplification. In one such particular case, the gain medium (Slab 2) of pre-amp 210 is sized so that the input beam provided by the master oscillator 205 is capable of achieving the saturation energy level for optimal extraction of the energy stored within Slab 2, in two passes (e.g., slab is about 2 to 6 times wider than input beam diameter). In other such cases, the saturation energy level necessary for extracting the desired amount of energy (as opposed to the optimal amount) need be achieved (i.e., optimal extraction is not required). The laser high reflector (Laser HR), waveplate (WP 3), and corner cube (CC 3) enable a double-pass of the beam through Slab 2 (from POL 2 to Laser HR, and back), which also has a variable dopant concentration and is side-pumped by nine diode bars. POL 2 then outcouples the double-passed amplified beam to the power amplifier 215 stage. Additional passes greater than two can be achieved in a number of ways, if so desired (e.g., optical switching scheme configured to direct the set number of passes prior to outcoupling). Such alternative embodiments add complexity to the optical layout.

The single-pass power amplifier 215 receives the output of the pre-amp 210 via a fold prism (Fold Prism 2), which is configured to direct the beam to the cavity input of the power amp 215. The power amp 215 then performs the final amplification of the input signal, using a variable dopant concentration gain medium (Slab 3), which is side-pumped by sixteen diode bars. In the example case shown, the output beam provided by the single-pass power amplifier 215 is 1064 nm at about 100 mJ, with a 4 mm diameter and 0.7 mrads divergence angle, although other output beam qualities can be provided, depending on factors such as the wavelength of the pump beam or beams and the type of slab/laser materials.

The optical components including Porro 1, Porro 2, WP 1, WP 2, WP 3, POL 1 POL 2, CC 1, CC 2, CC 3, and Q-switch can all be implemented with conventional components. Each can be made, for example, of typical optical materials suitable for IR and UV applications, such as BK7 or fused silica. Other suitable optical materials include sapphire, quartz, magnesium fluoride, and calcium fluoride. Numerous optical materials, components, and layout techniques can be employed in embodiments of the present invention, depending on target application demands. For instance, metal and/or dielectric coatings can be applied to the reflecting surfaces if so desired (e.g., to improve absorption and efficiency). Further, note that although components are shown to be included in modules, other embodiments may be implemented with some components outside the module including the slab. For instance, Fold Prism 1 and POL 2 can be implemented outside the pre-amp module 210. Similarly, the Fold Prism 2 can be implemented outside the power amp module 215. In this sense, the depiction of modules is not intended to limit the present invention to any particular structure or layout.

The eye-safe converter 220 in this example embodiment includes a splitter that receives the output of the power amp 215 provides a portion (or all) of the output laser signal to the optional eye-safe converter 220. The splitter can be implemented, for example, with a beam switch (e.g., mechanical moving mirror, or electro optically activated polarization switcher) which selects the desired output of either the Output Beam or Eye-safe Output Beam. Alternatively, the splitter can be implemented with a fixed reflector to produce a fixed ratio of the two output beams. In one such case, the output beams provided by the splitter include two 1064 nm beams, each at about 50 mJ. The split ratio can be adjusted as desired (e.g., 99:1 to 1:99, for output beam:eye-safe output beam power), and need not be 50:50. Note that the splitter can be implemented separately from the converter 220.

The converter section of the eye-safe converter 220 converts the beam provided by the splitter to an eye-safe wavelength, and can be implemented with conventional technology. In the example embodiment shown, the eye-safe converter is implemented as a compact KTP OPO-OPA module that provides a 1570 nm eye-safe output beam at about 35 mJ. The module includes a potassium titanyl phosphate (KTP) crystal ring optical parametric oscillator (OPO) followed by dual optical parametric amplifiers (OPAs). Additional details on eye-safe signal generation and suitable converter modules are described in U.S. Pat. No. 6,898,218, which is herein incorporated by reference in its entirety. FIG. 3 illustrates a graph showing high energy and efficiency of the KTP OPO-OPA eye-safe converter module shown in FIG. 2a. The pump laser spot size can be scaled to provide efficient operation (>40%) for a 100 mJ pump level. The output beam of converter module 220 can be used, for example, for eye-safe range-finding and target illumination.

With respect to the gain medium (slabs), and in accordance with one particular embodiment, Slabs 1, 2, and 3 are each implemented with variably doped Nd Ceramic YAG trapezoidal sheets. FIG. 2b is an end-view of a slab having a varied dopant concentration, configured in accordance with one embodiment of the present invention. In this particular example the outer sheets are undoped ceramic YAG and the inner sheet is the variably doped ceramic YAG. Conventional YAG doping techniques and dopants can be used (e.g., ytterbium or neodymium). FIG. 2c illustrates the varied dopant concentration portion of the slab shown in FIG. 2b. The higher concentration (e.g., 0.5 to 1.5%) is depicted with darker shading, and the lower concentration or undoped portions (e.g., 0.0 to 0.4%) are depicted with light to no shading. The concentration generally varies in a linear fashion from one end to the other (along the slab length). Note that FIGS. 2b and 2c show that the dopant concentration can vary along the slab cross-section (top to bottom) as well as along the slab length (end to end).

Slab 1 is directly diode pumped using two 100 W QCW bars; Slab 2 is directly diode pumped using nine 100 W QCW bars (3 stacks of 3 bars each, or other suitable configuration); and Slab 3 is directly diode pumped using sixteen 100 W QCW bars (4 stacks of 4 bars each, or other suitable configuration). In this example case, each bar is capable of providing about 20 mJ. The total pump delivered to each stage using a 200 μsec pump pulsewidth is thus about 40 mJ, 180 mJ and 320 mJ corresponding to a total pump energy of 540 mJ ($\eta$=18.5%). Diode efficiency is about 45% at 807 nm, and total diode input power is about 40 W at 20 Hz. As will be appreciated, there may be additional power usage by the system depending on the configuration. For instance, using a thermoelectric cooler (TEC) controller for stabilizing pump diode temperature in a desired absorption band requires a control power of about 40 W. Other features of the system may include, for instance, low weight (e.g., about 3 to 5 lbs, components only, no bench) and a volume of less than 0.1 cubic feet.

Note that the slabs vary in geometry. In particular, the absorption length per pass (e.g., length of the slab) is progressively longer from stage 1, to stage 2, to stage 3. In one specific case, Slabs 1, 2, and 3 have the following dimensions as shown in Table 1. Numerous other pump and slab geometry schemes for providing efficient absorption can be used, as will be apparent in light of this disclosure, and the present invention is not intended to be limited to any particular one.

TABLE 1

| Stage | Thickness (mm) | Width (mm) | Length (mm) |
|---|---|---|---|
| Slab 1 | 1.24 | 4.0 | 30.0 |
| Slab 2 | 3.5 | 6 | 45 |
| Slab 3 | 5 | 5 | 55 |

The slab geometry is a multi-bounce zig-zag configuration that provides a longer absorption path to reduce laser sensitivity to diode-pump wavelength. Variable Nd concentration is used to avoid high absorption at the pump-slab interface, reducing ASE threshold and asymmetric energy extraction. Combined with the increased absorption length and increasingly longer laser extraction, this arrangement optimizes laser efficiency and reduces laser sensitivity to pump diode wavelength.

In one specific example embodiment, the MOPA laser system is configured with the following features: 10 mJ, single transverse mode (TEM$_{00}$), 20 ns master oscillator-dual amplifier capable of producing 100 mJ; side-pumped ceramic Nd:YAG slabs with varied dopant concentration between 0 and 0.7%, and staged extraction geometry to provide progressively increased absorption length as well as ASE suppression; cold operation (e.g., −40° C. to +5° C.) at 795 nm absorption peak, and hot operation (e.g., +30° C. to +85° C.) at 807 nm absorption peak; reduced temperature sensitivity using a combination of staged progressively longer absorption lengths per pass, wider diode emission bandwidth (e.g., 5 nm to 7 nm), and separate Nd:YAG absorption bands depending on ambient temperature; and a smart diode drive controller accommodating increased pump diode efficiency at cold operating temperature.

Table 2 shows a set of example performance parameters for one such embodiment.

TABLE 2

| Parameter | Performance |
|---|---|
| Energy (mJ) | 100 |
| PRF (Hz) | 15-25 |
| Pulsewidth (ns) | 15-20 |
| Spatial Mode | TEM$_{00}$ |
| Axial Mode | Multi-mode |
| Beam Quality (M2) | 1.5 |
| Beam Quality (mm-mrad) | 2 |
| Optical-Optical Efficiency (%) | 18.7 |

Note, however, that the system can be configured to exhibit a wide range of performance parameters, depending on the intended application and its associated demands, and the system is not intended to be limited to any specific configuration or set of performance parameters.

Temperature Dependent Absorption Bands

Figure 4:
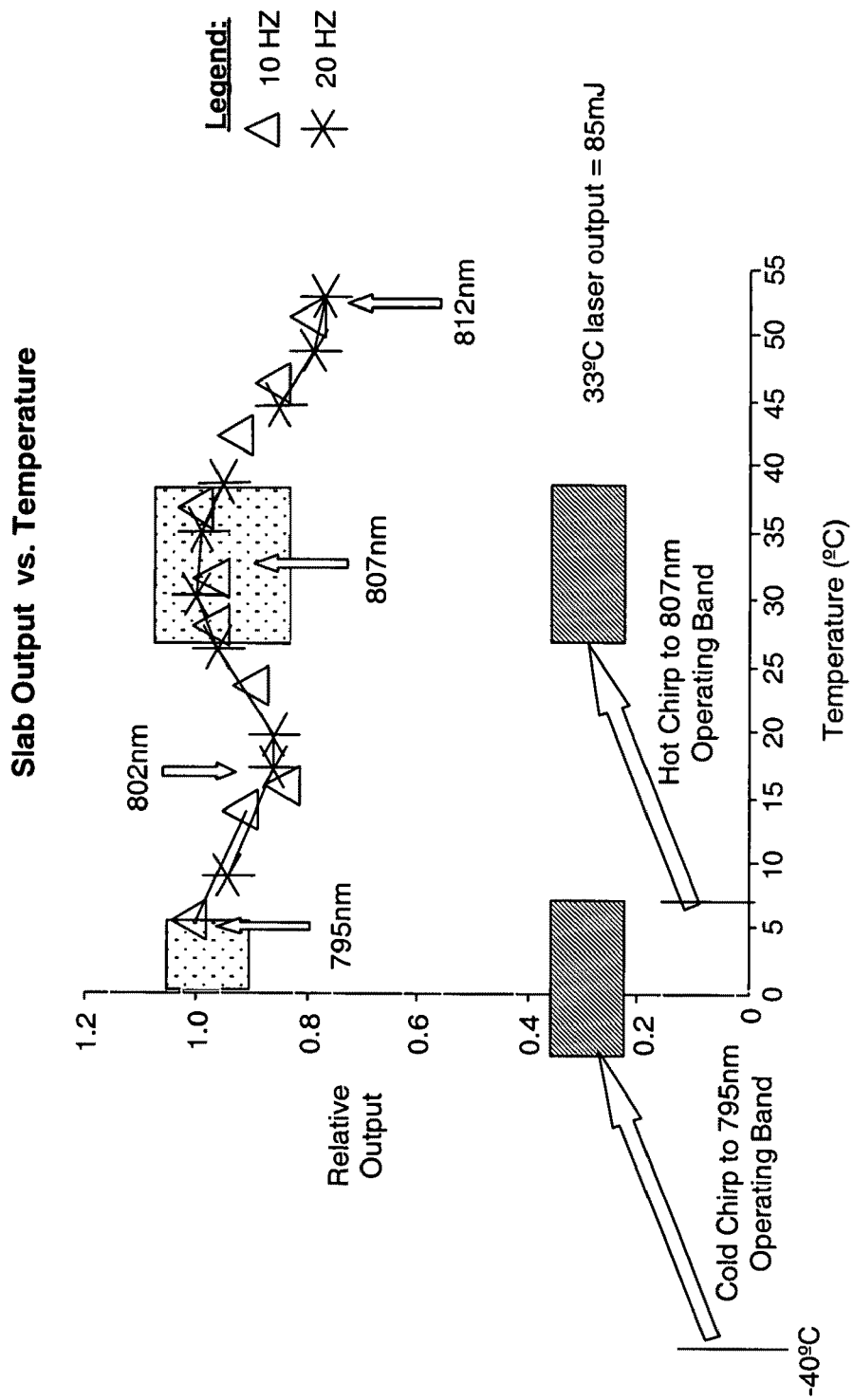
FIG. 4 illustrates a graph of measured laser performance vs. diode temperature, in accordance with one embodiment of the present invention.

In accordance with one embodiment of the present invention, and to minimize warm-up time and cooling power needed for diode wavelength stabilization, the MOPA laser system can be configured to operate on multiple absorption bands, depending on the ambient temperature. For example, in one such specific case, the system operates on either the 795 nm or 807 nm Nd:YAG absorption band using a single set of diodes (e.g., 27 bars as previously discussed and shown in FIG. 2a). FIG. 4 illustrates a graph of 1064 nm measured laser performance vs. diode temperature, in accordance with one embodiment of the present invention.

In more detail, FIG. 4 plots measured laser performance vs. diode temperature for a diode set emitting at 807 nm, 4 nm bandwidth, at approximately 33° C. As shown, identical laser performance is obtained between 0° C. and 5° C. where the diodes are emitting around 795 nm (taking advantage of the pump diode wavelength variation with temperature, which is about 0.28 nm/° C.). This approach provides increased operating temperature range with using minimal cooling power as pump diodes are heated to either point, depending on the ambient temperature. In one particular embodiment, the pump diode wavelength is specified at 807 nm @ 55° C., which will be equal to 795 nm @ 12° C. Additionally, the diode array bandwidth will be increased to approximately 6 nm (from the 3 nm standard) to desensitize laser performance vs. temperature (wavelength) with respect these center wavelengths.

Figure 5:
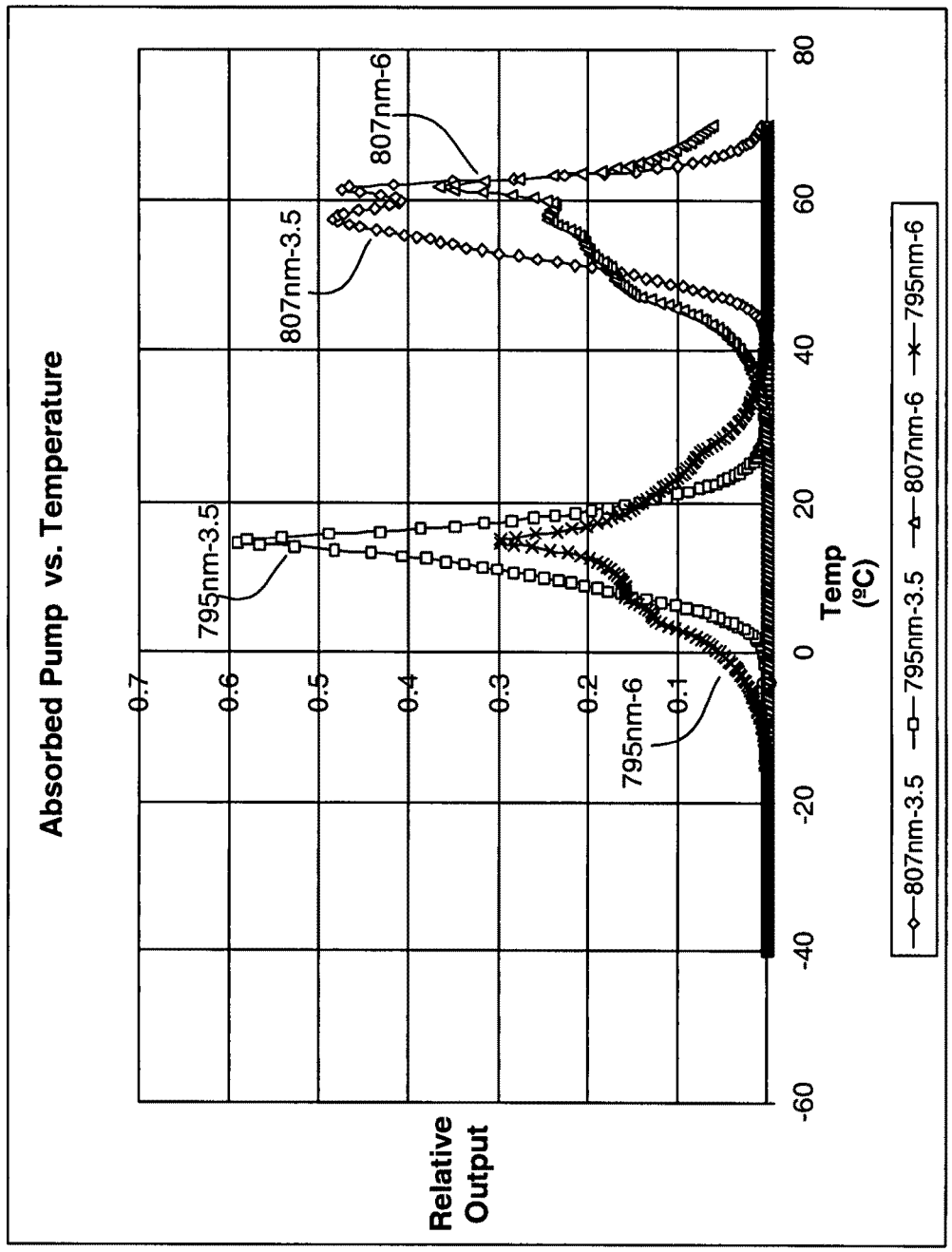
FIG. 5 illustrates a graph of model results for pump diode absorption vs. temperature for two center wavelengths and for two pump source bandwidths, in accordance with one embodiment of the present invention.

FIG. 5 plots model results for pump diode absorption vs. temperature for both 807 nm and 795 nm center wavelengths for the standard 3.5 nm bandwidth and 6 nm bandwidth, in accordance with an embodiment of the present invention. Both cold and hot operating bands have relatively broad operating temperature windows of approximately 15° C. Regardless of ambient temperature, the pump diodes' drive current will be actively adjusted to safely and rapidly chirp the pump diodes (bars) into the proper operating band. A TEC controller can be used to then stabilize diode temperature in that band for efficient laser operation.

The required cooling power is minimized, as the TEC controller is not required to cool diode thermal mass over a ΔT greater than 10° C. This approach does not eliminate the need for diode temperature control, but indicates this is a favorable trade vs. eliminating diode wavelength control by going to broader bandwidth diodes at reduced absorption efficiency. Additionally, laser performance vs. temperature is numb enough not to require limited temperature range Volume Bragg Gratings (VBGs). This direct, side-pumped approach, in combination with tailored absorption efficiency, uses minimum optics, in a compact, low weight, configuration and operates over the full MIL temperature range, thereby eliminating the need to engineer diode wavelength stabilization VBG to efficiently operate over more than 40° C. window.

The foregoing description of the embodiments of the invention has been presented for the purposes of illustration and description. It is not intended to be exhaustive or to limit the invention to the precise form disclosed. Many modifications and variations are possible in light of this disclosure. It is intended that the scope of the invention be limited not by this detailed description, but rather by the claims appended hereto.

What is claimed is:

1. A laser amplification system, comprising:
   a master oscillator for generating a seed laser beam, and having a gain medium associated with a first energy absorption length per pass;
   a multi-pass pre-amplifier for receiving the seed laser beam and generating an amplified version of that beam, using a multi-pass optical architecture, wherein the pre-amplifier has a gain medium associated with a second energy absorption length per pass that is longer than the first energy absorption length; and
   a single-pass power amplifier for receiving the amplified version of the seed laser beam and generating a laser output beam therefrom, using a single-pass optical architecture, wherein the power amplifier has a gain medium associated with a third energy absorption length per pass that is longer than the second energy absorption length.

2. The system of claim 1, further comprising:
   an eye-safe converter for receiving the laser output beam and converting that beam to an eye-safe wavelength.

3. The system of claim 1 wherein each of the gain mediums is a side-pumped ceramic Nd:YAG slab having a varied dopant concentration between about 0.0 and 1.5%.

4. The system of claim 1 wherein each of the gain mediums has a varied dopant concentration along both the length and cross-section.

5. The system of claim 1 wherein each of the gain mediums is directly pumped using diode bars.

6. The system of claim 1 wherein each of the gain mediums is pumped using a pump source having an emission bandwidth in the range of 5 nm to 7 nm.

7. The system of claim 1 wherein the gain medium of the multi-pass pre-amplifier is sized so that the seed laser beam is capable of achieving a desired energy level for extraction of energy stored within that gain medium, in two passes of the seed laser beam through that gain medium.

8. The system of claim 1, further comprising:
   a thermoelectric cooler (TEC) controller for stabilizing pump source temperature in a desired absorption band.

9. The system of claim 1 wherein the system is configured to operate on multiple absorption bands, depending on ambient temperature.

10. The system of claim 9 wherein the system uses a single set of pump diodes.

11. A method for laser amplification, comprising:
    generating a seed laser beam, using a gain medium associated with a first energy absorption length per pass;
    generating an amplified version of the seed laser beam, using a multi-pass optical architecture that includes a gain medium associated with a second energy absorption length per pass that is longer than the first energy absorption length; and
    generating a laser output beam from the amplified version of the seed laser, using a single-pass optical architecture that includes a gain medium associated with a third energy absorption length per pass that is longer than the second energy absorption length.

12. The method of claim 11, further comprising:
    converting the laser output beam to an eye-safe wavelength.

13. The method of claim 11 wherein each of the gain mediums is a ceramic Nd:YAG slab having a varied dopant concentration between about 0.0 and 1.5%, the method further comprising:

side-pumping each of the gain mediums using a pump source having an emission bandwidth in the range of 5 nm to 7 nm.

14. The method of claim 11 wherein each of the gain mediums has a varied dopant concentration along both is length and cross-section.

15. The method of claim 11, further comprising:
stabilizing pump source temperature in a desired absorption band.

16. A laser amplification system, comprising:
a master oscillator for generating a seed laser beam, and having a gain medium associated with a first energy absorption length per pass;
a multi-pass pre-amplifier for receiving the seed laser beam and generating an amplified version of that beam, using a double-pass optical architecture, wherein the pre-amplifier has a gain medium associated with a second energy absorption length per pass that is longer than the first energy absorption length; and
a single-pass power amplifier for receiving the amplified version of the seed laser beam and generating a laser output beam therefrom, using a single-pass optical architecture, wherein the power amplifier has a gain medium associated with a third energy absorption length per pass that is longer than the second energy absorption length;
wherein each of the gain mediums has a varied dopant concentration along both the length and cross-section.

17. The system of claim 16, further comprising at least one of:
an eye-safe converter for receiving the laser output beam and converting that beam to an eye-safe wavelength; and
a thermoelectric cooler (TEC) controller for stabilizing pump source temperature in a desired absorption band.

18. The system of claim 16 wherein each of the gain mediums is a side-pumped ceramic Nd:YAG slab having a varied dopant concentration between about 0.0 and 1.5%.

19. The system of claim 16 wherein each of the gain mediums is pumped using a pump source having an emission bandwidth in the range of 5 nm to 7 nm.

20. The system of claim 1 wherein the system is configured to operate on multiple absorption bands, depending on ambient temperature, uses a single set of pump diodes.

* * * * *